United States Patent
Lee et al.

(10) Patent No.: US 8,417,870 B2
(45) Date of Patent: Apr. 9, 2013

(54) SYSTEM AND METHOD OF INCREASING ADDRESSABLE MEMORY SPACE ON A MEMORY BOARD

(75) Inventors: Hyun Lee, Ladera Ranch, CA (US); Jayesh R. Bhakta, Cerritos, CA (US)

(73) Assignee: Netlist, Inc., Irvine, CA (US)

(*) Notice: Subject to any disclaimer, the term of this patent is extended or adjusted under 35 U.S.C. 154(b) by 936 days.

(21) Appl. No.: 12/504,131

(22) Filed: Jul. 16, 2009

(65) Prior Publication Data

US 2011/0016269 A1    Jan. 20, 2011

(51) Int. Cl.
*G06F 12/00* (2006.01)
*G06F 13/00* (2006.01)

(52) U.S. Cl.
USPC .............. 711/5; 711/100; 711/154

(58) Field of Classification Search .......... 711/5, 100, 711/104, 154; 710/307
See application file for complete search history.

(56) References Cited

U.S. PATENT DOCUMENTS

| | | | |
|---|---|---|---|
| 4,218,740 A | 8/1980 | Bennett et al. | |
| 4,368,515 A | 1/1983 | Nielsen | |
| 4,392,212 A | 7/1983 | Miyasaka et al. | |
| 4,633,429 A | 12/1986 | Lewandowski et al. | |
| 4,670,748 A | 6/1987 | Williams | |
| 4,706,214 A | 11/1987 | Kassai | |
| 4,866,603 A | 9/1989 | Chiba | |
| 4,958,322 A | 9/1990 | Kosugi et al. | |
| 4,961,172 A | 10/1990 | Shubat et al. | |
| 4,961,204 A | 10/1990 | Tanaka et al. | |
| 4,980,850 A | 12/1990 | Morgan | |
| 5,247,643 A | 9/1993 | Shottan | |
| 5,272,664 A | 12/1993 | Alexander et al. | |
| 5,345,412 A | 9/1994 | Shiratsuchi | |
| 5,357,478 A | 10/1994 | Kikuda et al. | |
| 5,388,072 A | 2/1995 | Matick et al. | |
| 5,388,240 A | 2/1995 | Olderdissen et al. | |
| 5,392,252 A | 2/1995 | Rimpo et al. | |
| 5,426,753 A | 6/1995 | Moon | |
| 5,483,497 A | 1/1996 | Mochizuki et al. | |
| 5,485,589 A | 1/1996 | Kocis et al. | |
| 5,495,435 A | 2/1996 | Sugahara | |
| 5,581,498 A | 12/1996 | Ludwig et al. | |
| 5,590,071 A | 12/1996 | Kolor et al. | |

(Continued)

FOREIGN PATENT DOCUMENTS

| | | |
|---|---|---|
| WO | WO 92/02879 | 2/1992 |
| WO | WO 94/07242 | 3/1994 |

(Continued)

OTHER PUBLICATIONS

U.S. Appl. No. 12/504,131, filed Jul. 16, 2009; Owned by Netlist, Inc.

(Continued)

*Primary Examiner* — Tuan V. Thai (57) ABSTRACT

A load-reducing memory module includes a plurality of memory components such as DRAMs. The memory components are organized into sets or ranks such that they can be accessed simultaneously for the full data bit-width of the memory module. A plurality of load reducing switching circuits is used to drive data bits from a memory controller to the plurality of memory components. The load reducing switching circuits are also used to multiplex the data lines from the memory components and drive the data bits to the memory controller.

20 Claims, 5 Drawing Sheets

U.S. PATENT DOCUMENTS

| | | |
|---|---|---|
| 5,602,999 A | 2/1997 | Hyatt |
| 5,638,534 A | 6/1997 | Mote, Jr. |
| 5,655,153 A | 8/1997 | Sandorfi |
| 5,699,542 A | 12/1997 | Mehta et al. |
| 5,702,984 A | 12/1997 | Bertin et al. |
| 5,703,826 A | 12/1997 | Hush et al. |
| 5,745,914 A | 4/1998 | Connolly et al. |
| 5,764,590 A | 6/1998 | Iwamoto et al. |
| 5,784,705 A * | 7/1998 | Leung ............................ 711/169 |
| 5,802,395 A | 9/1998 | Connolly et al. |
| 5,805,520 A | 9/1998 | Anglada et al. |
| 5,822,251 A | 10/1998 | Bruce et al. |
| RE36,229 E | 6/1999 | Cady |
| 5,909,388 A | 6/1999 | Mueller |
| 5,926,827 A | 7/1999 | Dell et al. |
| 5,926,839 A | 7/1999 | Katayama |
| 5,953,215 A | 9/1999 | Karabatsos |
| 5,958,025 A | 9/1999 | Sonobe |
| 5,959,930 A | 9/1999 | Sakurai |
| 5,963,464 A | 10/1999 | Dell et al. |
| 5,966,736 A | 10/1999 | Gittinger et al. |
| 5,974,493 A | 10/1999 | Okumura et al. |
| 6,018,787 A | 1/2000 | Ip |
| 6,044,032 A | 3/2000 | Li |
| 6,070,217 A | 5/2000 | Connolly et al. |
| 6,070,227 A | 5/2000 | Rokicki |
| 6,097,652 A | 8/2000 | Roh |
| 6,108,745 A | 8/2000 | Gupta et al. |
| 6,115,278 A | 9/2000 | Deneroff et al. |
| 6,134,638 A | 10/2000 | Olarig et al. |
| 6,151,271 A | 11/2000 | Lee |
| 6,154,418 A | 11/2000 | Li |
| 6,154,419 A | 11/2000 | Shakkarwar |
| 6,185,654 B1 | 2/2001 | Van Doren |
| 6,209,074 B1 | 3/2001 | Dell et al. |
| 6,226,709 B1 | 5/2001 | Goodwin et al. |
| 6,226,736 B1 | 5/2001 | Niot |
| 6,233,650 B1 | 5/2001 | Johnson et al. |
| 6,247,088 B1 | 6/2001 | Seo et al. |
| 6,317,352 B1 | 11/2001 | Halbert et al. |
| 6,349,051 B1 | 2/2002 | Klein |
| 6,400,637 B1 | 6/2002 | Akamatsu et al. |
| 6,408,356 B1 | 6/2002 | Dell |
| 6,414,868 B1 | 7/2002 | Wong et al. |
| 6,415,374 B1 | 7/2002 | Faue et al. |
| 6,438,062 B1 | 8/2002 | Curtis et al. |
| 6,446,158 B1 | 9/2002 | Karabatsos |
| 6,446,184 B2 | 9/2002 | Dell et al. |
| 6,453,381 B1 | 9/2002 | Yuan et al. |
| 6,470,417 B1 | 10/2002 | Kolor et al. |
| 6,487,102 B1 | 11/2002 | Halbert et al. |
| 6,502,161 B1 | 12/2002 | Perego et al. |
| 6,518,794 B2 | 2/2003 | Coteus et al. |
| 6,526,473 B1 | 2/2003 | Kim |
| 6,530,007 B2 | 3/2003 | Olarig et al. |
| 6,530,033 B1 | 3/2003 | Raynham et al. |
| 6,553,450 B1 | 4/2003 | Dodd et al. |
| 6,587,385 B2 * | 7/2003 | Ooishi ............................ 365/191 |
| 6,618,320 B2 | 9/2003 | Hasegawa et al. |
| 6,621,496 B1 | 9/2003 | Ryan |
| 6,625,081 B2 | 9/2003 | Roohparvar et al. |
| 6,625,687 B1 | 9/2003 | Halbert et al. |
| 6,636,935 B1 | 10/2003 | Ware et al. |
| 6,646,949 B1 | 11/2003 | Ellis et al. |
| 6,658,509 B1 | 12/2003 | Bonella et al. |
| 6,674,684 B1 | 1/2004 | Shen |
| 6,681,301 B1 | 1/2004 | Mehta et al. |
| 6,683,372 B1 | 1/2004 | Wong et al. |
| 6,697,888 B1 | 2/2004 | Halbert et al. |
| 6,705,877 B1 | 3/2004 | Li et al. |
| 6,717,885 B2 | 4/2004 | Lai |
| 6,721,843 B1 | 4/2004 | Estakhri |
| 6,721,860 B2 | 4/2004 | Klein |
| 6,738,880 B2 | 5/2004 | Lai et al. |
| 6,742,098 B1 | 5/2004 | Halbert et al. |
| 6,754,797 B2 | 6/2004 | Wu et al. |
| 6,785,189 B2 | 8/2004 | Jacobs et al. |
| 6,788,592 B2 | 9/2004 | Nakata et al. |
| 6,807,125 B2 | 10/2004 | Coteus et al. |
| 6,807,650 B2 | 10/2004 | Lamb et al. |
| 6,813,196 B2 | 11/2004 | Park et al. |
| 6,834,014 B2 | 12/2004 | Yoo et al. |
| 6,854,042 B1 | 2/2005 | Karabatsos |
| 6,880,094 B2 | 4/2005 | LaBerge |
| 6,889,304 B2 | 5/2005 | Perego et al. |
| 6,912,615 B2 | 6/2005 | Nicolai |
| 6,912,628 B2 | 6/2005 | Wicki et al. |
| 6,925,028 B2 | 8/2005 | Hosokawa et al. |
| 6,944,694 B2 | 9/2005 | Pax |
| 6,950,366 B1 | 9/2005 | Lapidus et al. |
| 6,954,281 B2 | 10/2005 | Fukuda et al. |
| 6,961,281 B2 | 11/2005 | Wong et al. |
| 6,981,089 B2 | 12/2005 | Dodd et al. |
| 6,982,892 B2 | 1/2006 | Lee et al. |
| 6,982,893 B2 | 1/2006 | Jakobs |
| 6,990,043 B2 | 1/2006 | Kuroda et al. |
| 6,996,686 B2 | 2/2006 | Doblar et al. |
| 7,007,130 B1 | 2/2006 | Holman |
| 7,007,175 B2 | 2/2006 | Chang et al. |
| 7,046,538 B2 | 5/2006 | Kinsley et al. |
| 7,047,361 B2 | 5/2006 | Chong et al. |
| 7,054,179 B2 | 5/2006 | Cogdill et al. |
| 7,065,626 B2 | 6/2006 | Schumacher et al. |
| 7,072,231 B2 | 7/2006 | Pax |
| 7,073,041 B2 | 7/2006 | Dwyer et al. |
| 7,078,793 B2 | 7/2006 | Ruckerbauer et al. |
| 7,120,727 B2 | 10/2006 | Lee et al. |
| 7,124,260 B2 | 10/2006 | LaBerge et al. |
| 7,127,584 B1 | 10/2006 | Thompson et al. |
| 7,130,952 B2 | 10/2006 | Nanki et al. |
| 7,133,960 B1 | 11/2006 | Thompson et al. |
| 7,133,972 B2 | 11/2006 | Jeddeloh |
| 7,142,461 B2 | 11/2006 | Janzen |
| 7,149,841 B2 | 12/2006 | LaBerge |
| 7,167,967 B2 | 1/2007 | Bungo et al. |
| 7,181,591 B2 | 2/2007 | Tsai |
| 7,200,021 B2 | 4/2007 | Raghuram |
| 7,227,910 B2 | 6/2007 | Lipka |
| 7,266,639 B2 | 9/2007 | Raghuram |
| 7,272,709 B2 | 9/2007 | Zitlaw et al. |
| 7,281,079 B2 | 10/2007 | Bains et al. |
| 7,286,436 B2 | 10/2007 | Bhakta et al. |
| 7,289,386 B2 | 10/2007 | Bhakta et al. |
| 7,346,750 B2 | 3/2008 | Ishikawa |
| 7,356,639 B2 | 4/2008 | Perego et al. |
| 7,370,238 B2 | 5/2008 | Billick et al. |
| 7,437,591 B1 | 10/2008 | Wong |
| 7,461,182 B2 | 12/2008 | Fukushima et al. |
| 7,471,538 B2 | 12/2008 | Hofstra |
| 7,532,537 B2 | 5/2009 | Solomon et al. |
| 7,619,912 B2 | 11/2009 | Bhakta et al. |
| 7,636,274 B2 | 12/2009 | Solomon et al. |
| 7,864,627 B2 | 1/2011 | Bhakta et al. |
| 7,881,150 B2 | 2/2011 | Solomon et al. |
| 8,130,560 B1 * | 3/2012 | Rajan et al. ............... 365/189.03 |
| 2001/0003198 A1 | 6/2001 | Wu |
| 2001/0050857 A1 | 12/2001 | Keeth et al. |
| 2001/0052057 A1 | 12/2001 | Lai |
| 2002/0088633 A1 | 7/2002 | Kong et al. |
| 2003/0063514 A1 | 4/2003 | Faue |
| 2003/0090359 A1 | 5/2003 | Ok |
| 2003/0090879 A1 | 5/2003 | Doblar et al. |
| 2003/0191995 A1 | 10/2003 | Abrosimov et al. |
| 2003/0210575 A1 | 11/2003 | Seo et al. |
| 2004/0000708 A1 | 1/2004 | Rapport et al. |
| 2004/0037158 A1 | 2/2004 | Coteus et al. |
| 2004/0201968 A1 | 10/2004 | Tafolla |
| 2005/0036378 A1 | 2/2005 | Kawaguchi et al. |
| 2005/0154820 A1 | 7/2005 | Briggs et al. |
| 2005/0281096 A1 | 12/2005 | Bhakta et al. |
| 2006/0044860 A1 | 3/2006 | Kinsley et al. |
| 2006/0117152 A1 | 6/2006 | Amidi |
| 2006/0126369 A1 | 6/2006 | Raghuram |
| 2006/0129755 A1 | 6/2006 | Raghuram |
| 2006/0179206 A1 | 8/2006 | Brittain et al. |
| 2006/0259711 A1 | 11/2006 | Oh |
| 2006/0262586 A1 * | 11/2006 | Solomon et al. ................. 365/63 |

| | | | |
|---|---|---|---|
| 2006/0267172 | A1 | 11/2006 | Nguyen et al. |
| 2006/0277355 | A1 | 12/2006 | Ellsbury et al. |
| 2007/0058409 | A1 | 3/2007 | Ruckerbauer et al. |
| 2008/0162790 | A1 | 7/2008 | Im |
| 2009/0103387 | A1 | 4/2009 | Shau |
| 2010/0128507 | A1 | 5/2010 | Solomon et al. |
| 2011/0016250 | A1 | 1/2011 | Lee et al. |
| 2011/0016269 | A1 | 1/2011 | Lee et al. |

FOREIGN PATENT DOCUMENTS

| | | |
|---|---|---|
| WO | WO 95/34030 | 12/1995 |
| WO | WO99/00734 | 7/1999 |
| WO | WO 02/058069 | 7/2002 |
| WO | WO02/063804 A2 | 8/2002 |
| WO | WO 03/017283 | 2/2003 |
| WO | WO 03/069484 | 8/2003 |
| WO | WO 2006/055497 | 5/2006 |

OTHER PUBLICATIONS

U.S. Appl. No. 12/761,179, filed Apr. 15, 2010; Owned by Netlist, Inc.
U.S. Appl. No. 12/815,339, filed Jun. 14, 2010; Owned by Netlist, Inc.
U.S. Appl. No. 12/774,632, filed May 5, 2010; Owned by Netlist, Inc.
U.S. Appl. No. 12/422,925, filed Apr. 13, 2009; Owned by Netlist, Inc.
U.S. Appl. No. 12/422,853, filed Apr. 13, 2009; Owned by Netlist, Inc.
U.S. Appl. No. 12/954,492, filed Nov. 24, 2010; Owned by Netlist, Inc.
U.S. Appl. No. 12/955,711, filed Nov. 29, 2010; Owned by Netlist, Inc.
U.S. Appl. No. 12/912,623, filed Oct. 26, 2010; Owned by Netlist, Inc.
U.S. Appl. No. 95/001,339, filed Jun. 8, 2010; Owned by Netlist, Inc.
U.S. Appl. No. 95/001,337, filed Jun. 4, 2010; Owned by Netlist, Inc.
U.S. Appl. No. 95/000,546, filed May 11, 2010; Owned by Netlist, Inc.
U.S. Appl. No. 95/001,381, filed Jun. 9, 2010; Owned by Netlist, Inc.
Request for Inter Partes Reexamination; Reexam U.S. Appl. No. 95/000,577 for U.S. Pat. No. 7,289,386 filed Oct. 20, 2010.
Request for Inter Partes Reexamination; Reexam U.S. Appl. No. 95/000,578 for U.S. Pat. No. 7,619,912 filed Oct. 20, 2010.
Request for Inter Partes Reexamination; Reexam U.S. Appl. No. 95/000,579 for U.S. Pat. No. 7,619,912 filed Oct. 21, 2010.
International Search Report and Written Opinion for related Application No. PCT/US2010/040826, mailed on Sep. 27, 2010, in 15 pages.
"64 & 72 Pin Zip/Simm Sram Module", JEDEC, Standard No. 21-C, www.jedec.com/download/search/4_04_01.pdf, Jun. 1997 pp. 4.4.1-1.
"Bank Striping of Data Across Internal SDRAM Banks," IP.com, IPCOM000013697D, 2000.
"Distributed Memory Mapping," IP.com, IPCOM000014788D, 2000.
"Information Huawei or FPGA—Take Five," Electronic News, 2002, p. 24.
"Method for a high-performance DRAM address mapping mechanism," IP.com, IPCOM000008164D, 2002.
"Method for memory probing on a multiple-DIMM bus," IP.com, IPCOM000019063D, 2003.
"Method for multiple device interface testing using a single device," IP.com, IPCOM000010054D, 2002.
"Quad Band Memory (QBMA™): DDR200/266/333 devices producing DDR400/533/667" (the "QBMA Reference"), published by the QBMA Alliance, Platform Conference, San Jose, California, Jan. 23-24, 2002.
"DDR SDRAM RDIMM Features," Micron Technology, Inc., 2002.
Abali, B. "Memory Expansion Technology (MXT): Software Support and Performance," IBM J. Res. & Dev., vol. 45, No. 2, 2001, pp. 287-300.
Arlington, DL Evans. "Enhancement of Memory Card Redundant Bit Usage Via Simplified Fault Alignment Exclusion," IMB Technical Disclosure Bulletin, 1987.
Arroyo et al. "Method of executing Manufacturing ROM Code Without Removing System Roms," IP.com, IPCOM000037214D, 1989.
Barr, Michael. "Programmable Logic: What's it to Ya?," Embedded Systems Programming, Jun. 1999, pp. 75-84.
Bennayoun et al. "Input/Output Chip Select Doubler," IBM Technical Disclosure Bulletin, vol. 38, No. 04 1995, pp. 237-240.
Blum et al. "Fast Multichip Memory System With Power Select Signal," IMB Technical Disclosure Bulletin, 1979.
Carvalho, Carlos; "The Gap between Processor and Memory Speeds"; ICCA '02.
Cuppu et al. "Concurrency, Latency, or System Overhead: Which Has the Largest Impact on Uniprocessor DRAM—System Performance?," IEEE, 2001, pp. 62-71.
Cuppu et al. "High-Performance DRAMs in Workstation Environments," IEEE Transactions on Computers, vol. 50, No. 11, 2001, pp. 1133-1153.
Cuppu et al. "A Performance Coparison of Contemporary DRAM Architectures," *IEEE Proceedings of the 26th International Symposium on Computer Architectures*, May 2-4, 1999, Atlanta, Geogia, pp. 1-12.
Denneau, M. "Logic Processor for Logic Simulation Machine," IBM Technical Disclosure Bulletin, vol. 25, No. 1, 1982.
Fairchild Semiconductor. "DM74LS138 DM74LS139 Decoder/Demultiplexer," Fairchild Semiconductor Corporation, 2000.
Fitzgerald et al. "Chip Select Circuit for Multi-Chip RAM Modules," IP.com, IPCOM000044404D, 1984.
Freedman, Alan. "The Computer Glossary," The Complete Illustrated Dictionary, American Management Association, 2001.
Gray, KS. "Fet Ram Chip Double Density Scheme," IP.com, IPCOM000043942D, 1984.
Grimes et al. "Access Rate/Availability Improvement Logic for Dynamic Memories," IBM Technical Disclosure Bulletin, Oct. 1982.
Gupta et al. "Designing and Implementing a Fast Crossbar Scheduler," IEEE Micro, 1999, pp. 20-28.
Hession et al. "Chip Select Technique for Multi Chip Decoding," IP.com, IPCOM000070404D, 1985.
Hewlett-Packard. "Memory technology evolution: an overview of system memory technologies," technology brief, 7th edition. 2003.
Hoare et al. "An 88-Way Multiprocessor Within an FPGA With Customizable Instructions," Proceedings of the 18th International Parallel and Distributed Processing Symposium, 2004.
Intel Corporation, 66/100 MHz PC SDRAM 64-Bit Non-ECC/Parity 144 Pin Unbuffered SO-DIMM Specification, Revision 1.0, Feb. 1999.
Intel Corporation, PC SDRAM Registered DIMM Design Support Document, Revision 1.2, Oct. 1998.
Jacob, Bruce L.; "Synchronous DRAM Architectures, Organizations, and Alternative Technologies". University of Maryland, Dec. 10, 2002.
JEDEC "JEDEC Standard: Double Data Rate (DDR) SDRAM Specification", JESD79C Mar. 2003.
JEDEC Standard JESD79D, "Double Data Rate (DDR) SDRAM Specification," published Feb. 2004.
Jedec Standard No. 21-C, "PC2100 and PC1600 DDR SDRAM Registered DIMM Design Specification," Revision 1.3, Jan. 2002.
JEDEC Standard No. 21-C, 4.20.5-184 Pin. PC1600/2100 DDR SDRAM Unbuffered DIMM Design Specification, Revision 1.1, Release 11b. Published Apr. 2003.
JEDEC Standard No. 21-C, 4.20.5-184 Pin. PC2700/PC2100/PC1600 DDR SDRAM Unbuffered SO-DIMM Reference Design Specification, Revision 1.1, Release 11b, Apr. 26, 2002.
JEDEC Standard No. 21-C, 4.20-2-168 Pin, PC133 SDRAM Registered Design Specification, Revision 1.4, Release 11a, Feb. 2002.
JEDEC Standard No. 21-C, 4.20-3-144 Pin, PC133 SDRAM Unbuffered SO-DIMM, Reference Design Specification, Revision 1.02, Release 11. Published Oct. 2003.
JEDEC Standard No. 21-C, DDR SDRAM PC2100 and PC1600 DDR SDRAM Registered DIMM Design Specification, Revision 1.3, Release 11b, Jan. 2002.

Jedec Standard, "Definition of the SSTV16859 2.5 V 13-Bit to 26-Bit SSTL_2 Registered Buffer for Stacked DDR DIMM Applications," JESD82-4B, May 2003.

Jin et al. "Embedded Memory in System-On-Chip Design: Architecture and Prototype Implementation," CCECE, 2003, pp. 141-146.

Jin et al. "Prototype Implementation and Evaluation of a Multibank Embedded Memory Archtecture in Programmable Logic," IEEE, 2003, pp. 13-16.

Kane et al. "Read Only Store Memory Extension," IP.com, IPCOM000082845D, 1975.

Karabatsos, C., "Quad Band Memory (QBM) Technology", Kentron Technologies, Inc., Apr. 2001, pp. 1-5.

Kellog, Mark; "PC133: SDRAM Main Memory Performance Reaches New Heights"; IBM Microelectronics, 1999.

Keltcher et al.; "The AMD Opteron Processor for Multiprocessor Servers"; IEEE Computer Society.

Kirihata et al.; "A 390-mm, 16-Bank, 1-Gb DDR SDRAM with Hybrid Bitline Architecture"; IEEE Journal of Solid-State Circuits, vol. 34, No. 11, Nov. 1999.

Kornaros et al. "A Fully-Programmable Memory Management System Optimizing Queue Handling at Multi Gigabit Rates," DAC, 2003, pp. 54-59.

Lee et al. "A banked-promotion translation lookaside buffer system," Journal of Systems Architecture, vol. 47, 2002, pp. 1065-1078.

Lee et al. "An on-chip cache compression technique to reduce decompression overhead and design complexity." Journal of Systems Architecture, vol. 46, 2000, pp. 1365-1382.

Lin et al. "Designing a Modern Memory Hierarchy with Hardware Prefetching," IEEE Transactions on Computers, vol. 50, No. 11, 2001, pp. 1202-1217.

Luthra et al. "Interface Synthesis Using Memory Mapping for an FPGA Platform," Proceedings of the 21st International Conference on Computer Design, 2003.

Matick et al. "Read-Select Capability for Static Random-Access Memory," IMB Technical Disclosure Bulletin, 1985, pp. 6640-6642.

Matick, RE. "Logic and Decoder Arrangement for Controlling Spill/Wrap Boundaries of a Bit-Addressable Memory Decoder," IMB Technical Disclosure Bulletin, 1984.

Meyers et al. "Use of Partially Good Memory Chips," IP.com, IPCOM000066246D, 1979.

Miles J. Murdocca et al., "Principles of Computer Architecture", Prentice Hall, 2000, pp. 249-251.

Ofek et al. "Partial Two Way Mapping Technique," IMB Technical Disclosure Bulletin, 1969.

Paldan, David. "Programmable Memory Address Decoding for Microprocessor Memory Device," IP.com, IPCOM000005486D, 1983.

Pellinger et al. "Dual Addressable Memory," IP.com, IPCOM000068610D, 1978.

Plotnick et al. "Shuffle Your Chips for Better Performance," PC Week, 1998, p. 90.

Schubert et al. "Accelerating system integration by enhancing hardware, firmware, and co-simulation," IBM J. Res. & Dev, vol. 48, No. 3/4, May/Jul. 2004, pp. 569-581.

Skelton, MH. "Program Controlled Paging Scheme for Memory Expansion," IP.com. IPCOM000050954D, 1982.

Siegel et al. "IBM's S/390 G5 Microprocessor Design," IEEE Micro, 1999, pp. 12-23.

Smith, BA. "Chip Select Decoder Circuit," IP.com, IPCOM000063400D, 1985.

Stelzer, KC. "Planar Memory Boundary Registers with Remap Feature," IMB Technical Disclosure Bulletin, 1993.

Sunaga et al. "An Enable Signal Circuit for Multiple Small Banks," IP.com, IPCOM000015887D, 2002.

Sunaga et al. "Continuous RAS Access Method in Multiple-bank DRAM Chip," IP.com, IPCOMM000123375D, 1998.

Toal et al. "A 32-Bit SoPC Implementation of a P5." Proceedings of the Eighth IEEE International Symposium on Computers and Communications, 2003, pp. 1530-1346.

Tudruj, Marek. "Dynamically reconfigurable heterogenous multi-processor systems with transputer-controlled communication," Journal of Systems Architecture, vol. 43, 1997, pp. 27-32.

Yao, YL. High Density Memory Selection Circuit,: IP.com, IPCOM000078218D, 1972.

Kazusawa, et al. "RAS Buffering Technique to Prevent Stored Data Destruction in DRAM Standby State," dated Jan. 1, 1996, p. 341-344.

Qureshi, "High Utilization and Reliability Memory Bit Steering Method," dated Mar. 1, 1995, p. 615-616.

Takai, et al. "250 Mbyte/s Synchronous DRAM using a 3-Stage-Pipelined Architecture," IEEE Journal of Solid-State Circuits, vol. 29, No. 4, p. 426-431, dated Apr. 1994.

Ayukawa, et al., "An Access-Sequence Control Scheme to Enhance Random-Access Performance of Embedded DRAM's," IEEE Journal of Solid-State Circuits, vol. 33, No. 5, p. 800-806, dated May 1998.

Written Opinion for International Application No. PCT/US2010/040826, date of mailing Oct. 24, 2011 in 6 pages.

International Preliminary Report on Patentability for International Application No. PCT/US2010/040826, date of mailing Nov. 28, 2011 in 34 pages.

Non-Final Office Action mailed Mar. 23, 2012, for U.S. Appl. No. 12/761,179, filed Apr. 15, 2010, 33 pages.

Response filed Jun. 21, 2012 to Non-Final Office Action mailed Mar. 23, 2012, for U.S. Appl. No. 12/761,179, filed Apr. 15, 2010, 11 pages.

Non-Final Office Action mailed Sep. 13, 2012, for U.S. Appl. No. 12/761,179, filed Apr. 15, 2010, 20 pages.

US 6,832,284, 12/2004, Perego et al. (withdrawn)

* cited by examiner

SYSTEM AND METHOD OF INCREASING ADDRESSABLE MEMORY SPACE ON A MEMORY BOARD

CROSS-REFERENCE TO RELATED APPLICATION

Not Applicable

FEDERALLY SPONSORED RESEARCH OR DEVELOPMENT

Not Applicable

BACKGROUND

The present disclosure relates generally to memory subsystems of computer systems and more specifically to systems, devices, and methods for improving the performance and the memory capacity of memory subsystems or memory "boards," particularly memory boards that include dual in-line memory modules (DIMMs).

Certain types of computer memory subsystems include a plurality of dynamic random-access memory (DRAM) or synchronous dynamic random access memory (SDRAM) devices mounted on a printed circuit board (PCB). These memory subsystems or memory "boards" are typically mounted in a memory slot or socket of a computer system, such as a server system or a personal computer, and are accessed by the processor of the computer system. Memory boards typically include one or more memory modules, each with a plurality of memory devices (such as DRAMs or SDRAMs) in a unique configuration of rows, columns, and banks, which provide in a total memory capacity for the memory module.

The memory devices of a memory module are generally arranged as ranks or rows of memory, each rank of memory generally having a bit width. For example, a memory module in which each rank of the memory module is 64 bits wide is described as having an "x64" or "by 64" organization. Similarly, a memory module having 72-bit-wide ranks is described as having an "x72" or "by 72" organization.

The memory capacity of a memory module increases with the number of memory devices. The number of memory devices of a memory module can be increased by increasing the number of memory devices per rank or by increasing the number of ranks. Rather than referring to the memory capacity of the memory module, in certain circumstances, the memory density of the memory module is referred to instead.

During operation, the ranks of a memory module are selected or activated by control signals that are received from the processor. Examples of such control signals include, but are not limited to, rank-select signals, also called chip-select signals. Most computer and server systems support a limited number of ranks per memory module, which limits the memory density that can be incorporated in each memory module.

The memory space in an electronic system is limited by the physically addressable space that is defined by the number of address bits, or by the number of chips selected. In general, once the memory space is defined for an electronic system, it would not be feasible to modify the memory space without an extensive design change. This is especially true for the case in which a memory space is defined by a consortium, such as JEDEC. A problem arises when a user's application requires a larger addressable memory space than the memory space that the current electronic system is designed to support.

In developing a memory subsystem, consideration is always given to memory density, power dissipation (or thermal dissipation), speed, and cost. Generally, these attributes are not orthogonal to each other, meaning that optimizing one attribute may detrimentally affect another attribute. For example, increasing memory density typically causes higher power dissipation, slower operational speed, and higher costs.

Furthermore, the specifications of the memory subsystem may be guided by physical limitations associated with these attributes. For example, high thermal dissipation may limit the speed of the operation, or the physical size of the memory module may limit the density of the module.

These attributes generally dictate the design parameters of the memory module usually requiring that the memory system slow down operation speed if the memory subsystem is populated with more memory devices to provide higher density memory cards.

Currently there are two major methods of increasing memory space. The first method is based on an address decoding scheme. This method is very widely adopted in the electronics industry in designing Application-Specific Integrated Circuit (ASIC) and System-On-Chip (SOC) devices to expand system memories. The second method increases the addressable memory space without extensive alteration of the software or hardware of an existing electronics system. This method combines chip select signals with an address signal to double the number of physically addressable memory spaces. These methods have several shortcomings. For example, since these methods increase the addressable memory space by directly adding memory chips, a heavier load is presented to the system controller outputs and the memory device outputs, resulting in a slower system. Also, increasing the number of memory devices also results in higher power dissipation. In addition, since an increase in the number of memory devices on each memory card alters the physical property of the memory card while the system board remains the same, the overall signal (transmission line) wave characteristics deviate from the original design intent or specification. Furthermore, especially when registered DIMMs (RDIMMs) are used, the increase in the number of the memory devices translates to an increase in the distributed RC load on the data paths, but not on the address and control paths, thereby introducing uneven signal propagation delay between the data signal paths and address and control signal paths.

Figure 1:
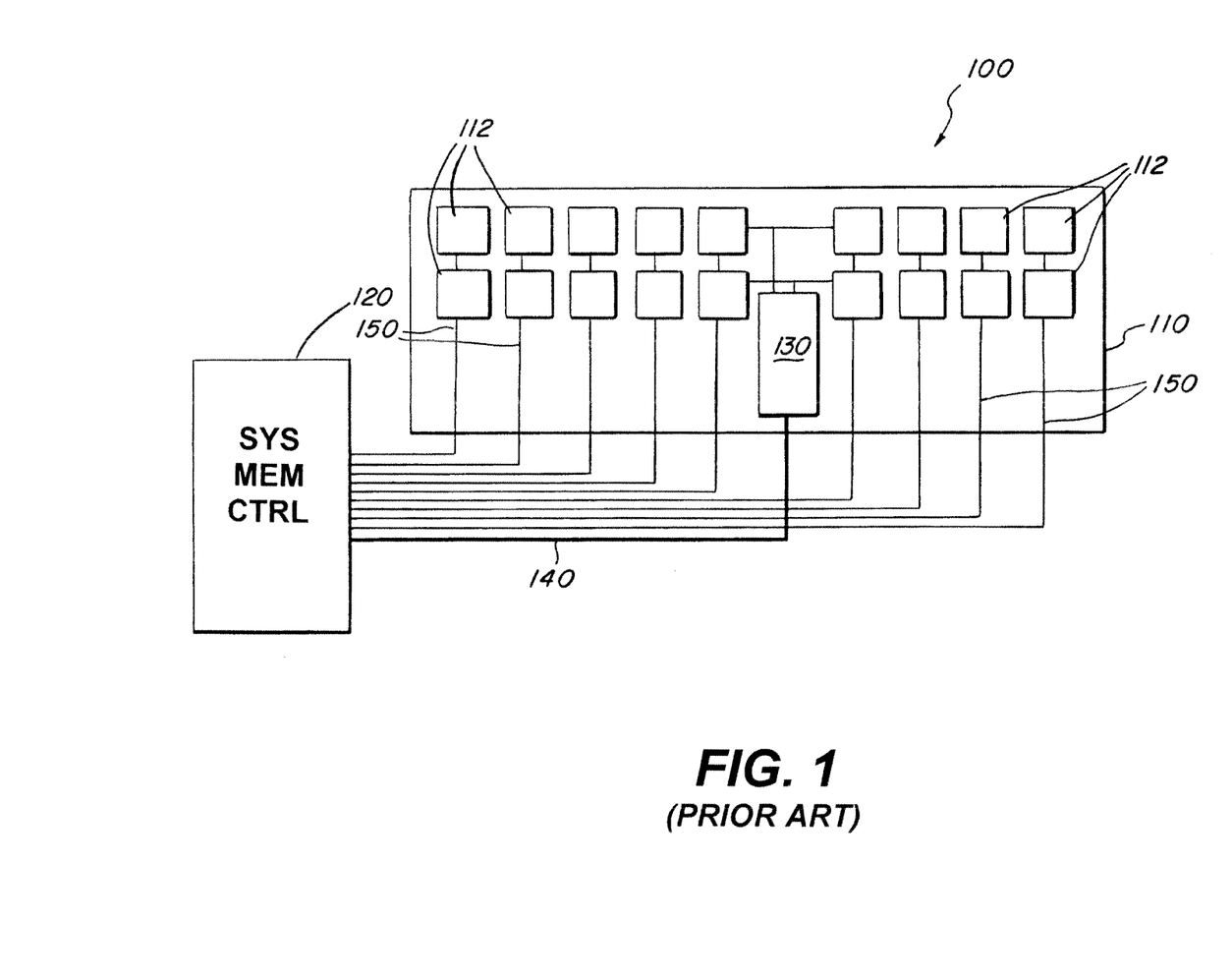
FIG. 1 is a schematic representation of a conventional memory subsystem populated with JEDEC standard two-rank memory modules.
Figure 2:
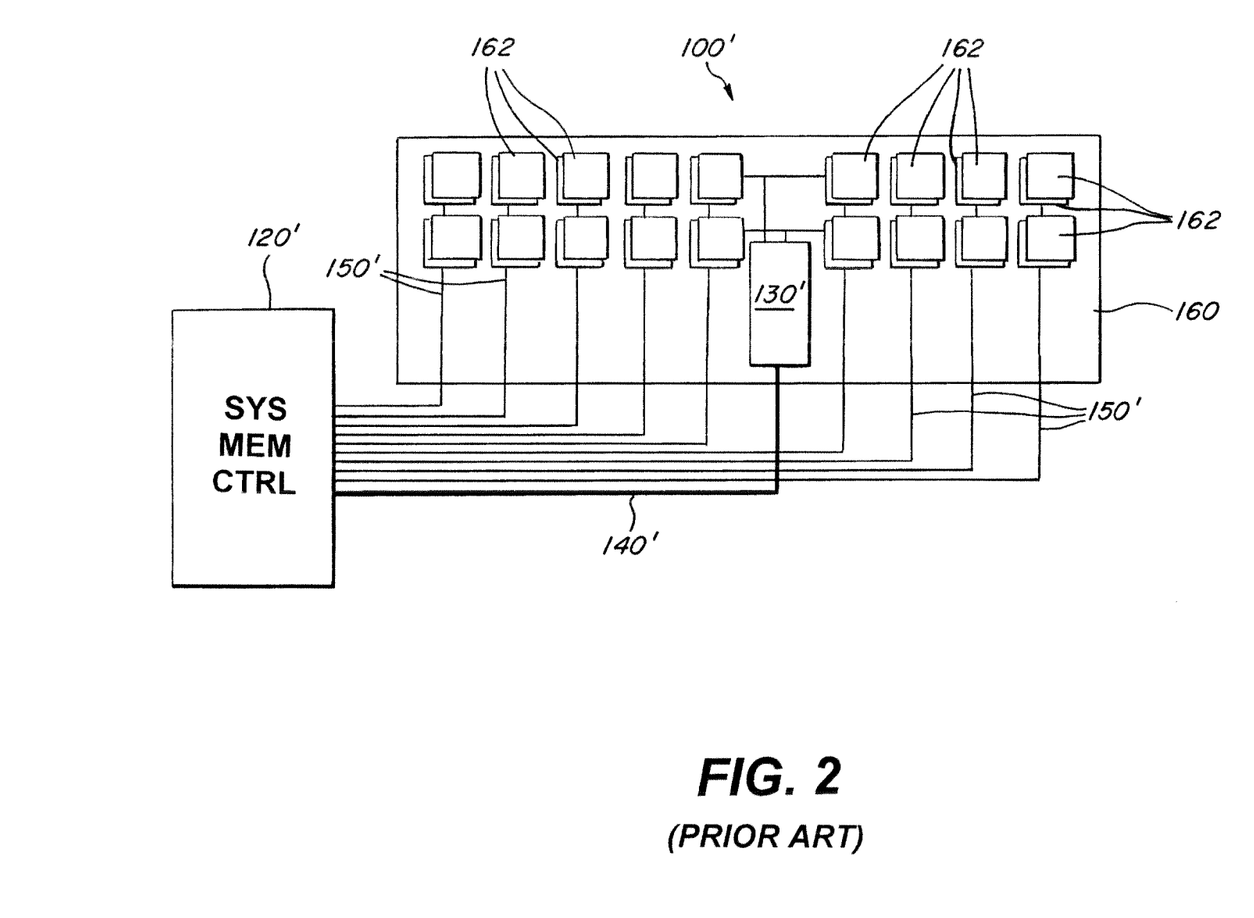
FIG. 2 is a schematic representation of a conventional memory subsystem populated with JEDEC standard four-rank memory modules.

FIGS. 1 and 2 illustrate the prior art approach of increasing the number of memory devices. Specifically, FIG. 1 shows a standard memory subsystem 100 with at least one JEDEC standard two-rank memory module 110 (e.g., a registered dual in-line memory module, or "RDIMM," only one of which is shown for clarity), wherein each module comprises a plurality memory devices 112 (e.g., DRAMs or SDRAMs). This subsystem requires each data line of an array of data lines 150 from a system memory controller 120 to be connected to a memory device 112 in each rank in each memory module 110. A register 130 receive a plurality of address and control lines 140 from the controller 120. Therefore, the system memory controller 120 see all the memory devices 112 as its load during a write operation, and each memory device 112 also sees multiple other memory devices 112, as well as the system memory controller 120, as its load during a read operation. FIG. 2 is a schematic view of a standard memory subsystem 100' with at least one JEDEC standard four-rank memory module 160 (only one of which is shown), each comprising a plurality of memory devices 162. Each memory module 160 presents four fanouts to the data outputs of the system memory controller 120', which is connected to each of the memory devices by means of a register 130' receiving a plurality of address and control lines 140', and by means of an array of data lines 150'. Therefore, as with the two-rank module shown in FIG. 1, the system memory controller 120' sees all the memory devices 162 as its load during a write operation, while each memory device 162 sees multiple other memory devices 162 and the system memory controller 120' as its load during a read operation.

Therefore, these prior art techniques not only reduce the speed of the memory systems, but they also require hardware modifications to minimize any deviation of the transmission line wave characteristics from the original design specification

SUMMARY

The present disclosure relates broadly to a load-reducing memory module, including a printed circuit board having a plurality of memory devices, such as DRAMs or SDRAMs. The devices are organized into ranks that may be accessed simultaneously for the full data bit-width of the memory module.

One embodiment provides a memory module including: a plurality of memory devices; a controller configured to receive control information from a system memory controller and produce module control signals; and a switching circuit for isolating the plurality of memory devices from the system memory controller, where the switching circuit is configured to drive write data from the system memory controller to the plurality of memory devices and is configured to merge read data from the plurality of memory devices to the system memory controller, and where the switching circuit drives or merges data in response to the module control signals.

Within the memory module, the plurality of memory devices may include a first group of the plurality of memory devices in a first rank and a second group of the plurality of memory devices in a second rank. The memory module may be configured to combine the first rank and the second rank into one logical memory rank. The plurality of memory devices may further include a third group of the plurality of memory devices in a third rank and a fourth group of the plurality of memory devices in a fourth rank, and where data lines of the first rank are connected to data lines of the first rank and to the switching circuit, and data lines of the second rank are connected to data lines of the fourth rank and to the switching circuit.

Within the memory module with first and second ranks, the switching circuit may include: a data terminal for coupling to the system memory controller; a first memory terminal coupled to the first group of the plurality of memory devices; and a second memory terminal coupled to the second group of the plurality of memory devices, and wherein, when the switching circuit drives write data, the data terminal is coupled to the first memory or to the second memory terminal, and when the switching circuit merges read data, the first memory terminal or the second memory terminal is coupled to the data terminal. The switching circuit may further include: a read buffer configured to conditionally drive the data terminal; a first tristate buffer configured to conditionally drive the first memory terminal; and a second tristate buffer configured to conditionally drive the second memory terminal. The switching circuit may further include: a write buffer configured to receive data signals from the data terminal and to supply the received data signals to the first tristate buffer and the second tristate buffer; a multiplexer configured to receive data signals from the first memory terminal and data signals from the second memory terminal and supply data signals selected from the data signals received from the first memory terminal and the data signals received from the second memory terminal to the read buffer.

The memory module may be a dual in-line memory module. The memory devices may include synchronous dynamic random access memories. The bi-directional switch may be configured to reshape a signal waveform. The controller may include a register for latching address and control signals from the memory controller.

Another embodiment provides a method of operating a memory module, the method including: providing a load-reducing switching circuit on a data line between a computer system memory controller and a plurality of memory devices; during a write operation, enabling the load-reducing switching circuit to drive a data signal from the computer system memory controller on one of a plurality of paths to memory devices of the memory module; and during a read operation, enabling the load-reducing switching circuit to merge a plurality of data signals from the memory devices of the memory module and driving the merged data signal to the computer system memory controller.

Within the method, the enabling the load-reducing switching circuit may include extracting control information from the computer system memory controller to provide an enable control signal to the load-reducing switching circuit.

Within the method, the enabling the load-reducing switching circuit, during a write operation, to drive a data signal from the computer system memory controller on one of a plurality of paths to memory devices of the memory module may include performing a regenerative buffer function on the data signal.

Within the method, the enabling the load-reducing switching circuit, during a read operation, to merge a plurality of data signals from the memory devices of the memory module and driving the merged data signal to the computer system memory controller may include performing a multiplex function on data signals from the memory devices of the memory module.

The method may further include combining two or more physical memory ranks into one logical memory rank. The two or more physical memory ranks may be accessible with a single chip select signal from the computer system memory controller.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components bear like designations and numbering throughout the figures.

DETAILED DESCRIPTION

Figure 3:
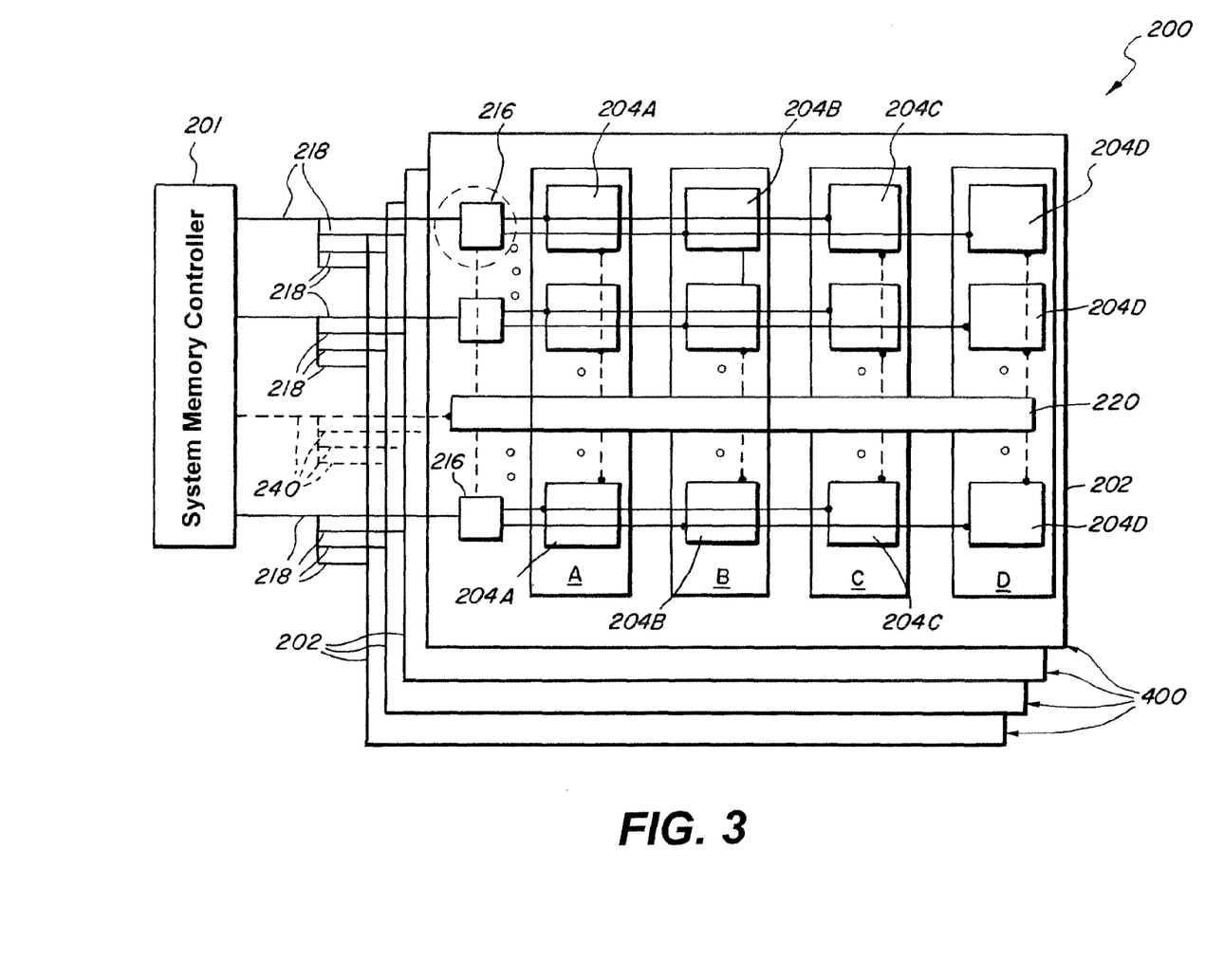
FIG. 3 is a schematic representation of a memory subsystem in accordance with an embodiment of the disclosure.

FIG. 3 schematically illustrates an exemplary memory subsystem 200 with load-reduced memory modules in accordance with embodiments described herein. The memory subsystem 200 is designed, for example, to deliver higher speed and higher memory density with lower thermal dissipation as compared with conventional memory subsystems.

As shown in FIG. 3, the memory subsystem 200 is coupled to a memory controller 201, of any type well-known in the art. The memory subsystem 200 typically includes a plurality of memory modules 202, such as DIMMs or RDIMMs, details of which are shown only for one for clarity. Components of the memory modules 202 may be mounted on or in printed circuit boards (PCBs) 400, which may be arranged in a vertical stack (as shown), or in a back-to-back array. Each module 202 includes a plurality of memory devices 204 (such as DRAMs or SDRAMs). The memory devices 204 may advantageously be arranged in a plurality of rows or ranks. In the embodiment illustrated in FIG. 3, the memory devices 204 are arranged in four ranks, designated A, B, C, and D, although embodiments with less than or more than four ranks may be employed.

Each memory module 202 is includes one or more load-reducing switching circuits 216. The load-reducing switching circuits 216 bidirectionally buffer data signals between the memory controller 201 and the memory devices 204. In the exemplary embodiment of this disclosure, each of the load-reducing switching circuits 216 is connected to one memory device 204 in each of the four ranks, A, B, C, and D. For the sake of this disclosure the devices in rank A are designated 204A; those in rank B are designated 204B; those in rank C are designated 204C; and those in rank D are designated 204D. In the embodiment of FIG. 3, each load-reducing switching circuit 216 has the same bit width for example 8 bits, as the associated memory devices 204. In other embodiments, the bit widths of the load-reducing switching circuits 216 and the memory devices 204 may be different. For example, the load-reducing switching circuits 216 may have a bit width of 16 and the memory devices 204 may have bit width of 8 with each load-reducing switching circuit 216 connected to two memory devices 204 in each rank.

Each memory module 202 includes a module controller 220. The module controller 220 is coupled to address and control lines 240 (e.g., bank address signals, row or rank address signals, column address signals, address strobe signals, and chip-select signals) from the system memory controller 201. The module controller 220 registers address and control lines 240 in a manner functionally comparable to the address register of a convention RDIMM. The registered address and control lines 240 are supplied to the memory devices 204. Additionally, the module controller 220 supplies control signals for the load-reducing switching circuits 216. The control signals indicate, for example, the direction of data flow, that is, to or from the memory devices. The module controller 220 may produce additional chip select signals or output enable signals based on address decoding.

In certain embodiments, the memory modules 202 may include electrical components that are electrically coupled to one another. The electrical components may be surface-mounted, through-hole mounted, or otherwise connected to the PCB 400. These electrical components may include, but are not limited to, electrical conduits, resistors, capacitors, inductors, and transistors. In certain embodiments, at least some of these electrical components are discrete, while in other certain embodiments, at least some of these electrical components are constituents of one or more integrated circuits.

Various types of memory modules 202 are compatible with embodiments described herein. For example, memory modules having memory capacities of 512 MB, 1 GB, 2 GB, 4 GB, 8 GB, as well as other capacities, are compatible with embodiments described herein. In addition, memory modules having widths of 4 bytes 8 bytes, 9 bytes, 16 bytes, 32 bytes, or 32 bits, 64 bits, 72 bits, 128 bits, 256 bits, as well as other widths (in bytes or in bits), are compatible with embodiments described herein. Furthermore, memory modules compatible with embodiments described herein include, but are not limited to, single in-line memory modules (SIMMs), dual in-line memory modules (DIMMs) small-outline DIMMs (SO-DIMMs), unbuffered DIMMs (UDIMMs), registered DIMMs (RDIMMs), fully-buffered DIMMs (FBDIMMs), mini-DIMMs, and micro-DIMMs.

In some embodiments, the PCBs 400 are mountable in module slots (not shown) of the computer system. The PCBs 400 of some such embodiments have a plurality of edge connections (not shown) configured to make electrical contact with corresponding contacts of the module slots and to the various components of the memory modules on the PCBs, thereby providing electrical connections between the computer system and the components of the memory module.

Memory devices 204 compatible with embodiments described herein include, but are not limited to, random-access memory (RAM), dynamic random-access memory (DRAM), synchronous DRAM (SDRAM), and double-data-rate DRAM (e.g., DDR, DDR2, DDR3, etc). In addition, memory devices having bit widths of 4, 8, 16, 32, as well as other bit widths, are compatible with embodiments described herein. Memory devices 204 compatible with embodiments described herein have packaging which include, but are not limited to, thin small-outline package (TSOP), ball-grid-array (BGA), fine-pitch BGA (FBGA), micro-BGA (µBGA), mini-BGA (mBGA), and chip-scale packaging (CSP).

In some embodiments, the load-reducing switching circuits 216 may include one or more functional devices, such as a programmable-logic device (PLD), an application-specific integrated circuit (ASIC), a field-programmable gate array (FPGA), a custom-designed semiconductor device, or a complex programmable-logic device (CPLD). In some embodiments, the load-reducing switching circuits 216 may be custom devices. In some embodiments, the load-reducing switching circuits 216 may include various discrete electrical elements; while in other embodiments, the load-reducing switching circuits 216 may include one or more integrated circuits.

Each of the load-reducing switching circuits 216, in accordance with an embodiment of this disclosure, is inserted into one or more of the data lines 218 connected to one memory device in each of the ranks A, B, C, D. Thus, each load-reducing switching circuit 216 is connected to one each of the memory devices 204A, 204B, 204C, and 204D. Each data line 218 thus carries data from the system memory controller 201, through the load-reducing switching circuits 216, to the memory devices 204A, 204B, 204C, 204D connected to each of the load-reducing switching circuits 216. The load-reducing switching circuits 216 may be used to drive each data bit to and from the memory controller 201 and the memory devices 204 instead of the memory controller 201 and the memory devices 204 directly driving each data bit to and from the memory controller 201 and the memory devices 204. Specifically, as described in more detail below, one side of each load-reducing switching circuit 216 is coupled to a memory device in each rank, while the other side of the load-reducing switching circuit 216 is coupled to the corresponding data line 218 of the memory controller 201.

To reduce the memory device loads seen by the system memory controller 201, the load-reducing switching circuit 216 is advantageously configured to be recognized by the system memory controller 201 as a single memory load. This advantageous result is desirably achieved in certain embodiments by using the load-reducing switching circuit 216 to electrically isolate the memory devices 204 from the memory controller 201. Therefore, in the example of FIG. 3, each data bit from the system memory controller 201 sees, for one memory module 202, a single load, which is presented by one load-reducing switching circuit 216, instead of the four memory devices 204A, 204B, 204C, 204D to which the load-reducing switching circuit 216 is coupled. In comparison to the standard JEDEC four rank DIMM configuration (see FIG. 2), the memory system 200 may reduce the load on the system memory controller 201 by a factor of four.

Figure 4:
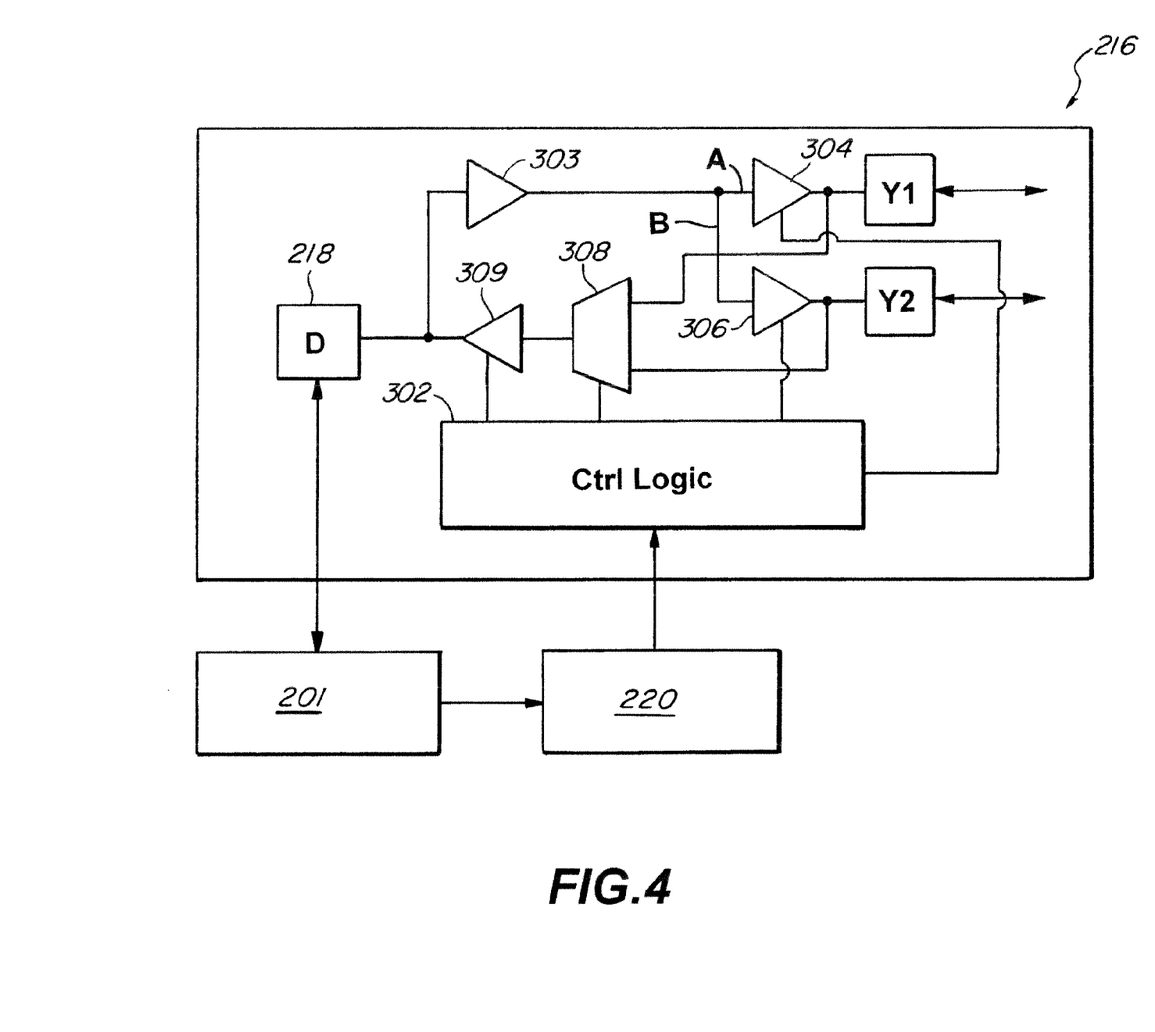
FIG. 4 is a schematic representation of an exemplary embodiment of a load-reducing switching circuit of the type employed in the memory subsystem of FIG. 3.

FIG. 4 schematically illustrates an exemplary load-reducing switching circuit 216 compatible with embodiments described herein. In one embodiment, the load-reducing switching circuit 216 includes control logic circuitry 302 used to control the various components of the load-reducing switching circuit, which may include buffers, switches, and multiplexers among other components. The illustrated embodiment is 1-bit wide and switches a single data line 218 between the memory controller 201 and the memory devices 204. In other embodiments, the load-reducing switching circuit 216 may be multiple bits wide, for example, 8 bits, and switch a corresponding number of data lines 218. In a multiple bit wide embodiment, the control logic circuitry 302 may be shared over the multiple bits.

As a part of isolating the memory devices 204 from the system memory controller 201, in one embodiment, the load-reducing switching circuits 216 allow for "driving" write data and "merging" read data. In the operational embodiment shown in FIG. 4, in a write operation, data entering a load-reducing switching circuit 216 via a data line 218 is driven onto two data paths, labeled path A and path B, preferably after passing through a write buffer 303. The ranks of memory devices 204 are likewise divided into two groups with one group associated with path A and one group associated with path B. As shown in FIG. 3, rank A and rank C are in the first group, and rank B and rank D are in the second group. Accordingly, the memory devices 204A, 204C of rank A and rank C are connected to the load-reducing switching circuits 216 by a first one of the two data paths, and the memory devices 204B, 204D of rank B and rank D are connected to the load-reducing switching circuits 216 by a second one of the two data paths. In other embodiments, the driving of write data and merging of read data may be performed over more than two data paths.

As is known, Column Address Strobe (CAS) latency is a delay time which elapses between the moment the memory controller 201 informs the memory modules 202 to access a particular column in a selected rank or row and the moment the data for or from the particular column is on the output pins of the selected rank or row. The latency may be used by the memory module to control operation of the load-reducing switching circuits 216. During the latency, address and control signals pass from the memory controller 201 to the module controller 220 which produces controls sent to the control logic circuitry 302 which then controls operation of the components of the load-reducing switching circuit 216.

For a write operation, during the CAS latency, the module controller 220, in one embodiment, provides enable control signals to the control logic circuitry 302 of each load-reducing switching circuit 216, whereby the control logic circuitry 302 selects either path A or path B to direct the data. Accordingly when the control logic circuitry 302 receives, for example, an "enable A" signal, a first tristate buffer 304 in path A is enabled and actively drives the data value on its output, while a second tristate buffer 306 in path B is disabled with its output in a high impedance condition. In this state, the load-reducing switching circuit 216 allows the data to be directed along path A to a first terminal Y1, which is connected to and communicates only with the first group of the memory devices 204, i.e., those in ranks A and C. Similarly, if an "enable B" signal is received, the first tristate 304 opens path A and the second tristate 306 closes path B, thus directing the data to a second terminal Y2, which is connected to and communicates only with the second group of the memory devices 204, i.e., those in ranks B and D.

For a read operation, the load-reducing switching circuit 216 operates as a multiplexing circuit. In the illustrated embodiment, for example, data signals read from the memory devices 204 of a rank are received at the first or second terminals Y1, Y2 of the load-reducing switching circuit 216. The data signals are fed to a multiplexer 308, which selects one to route to its output. The control logic circuitry 302 generates a select signal to select the appropriate data signal, and the selected data signal is transmitted to the system memory controller 201 along a single data line 218, preferably after passing through a read buffer 309. The read buffer 309 may be a tristate buffer that is enabled by the control logic circuitry 302 during read operations. In another embodiment, the multiplexer 308 and the read buffer 309 may be combined in one component. In yet another embodiment, the multiplexer 308 and the read buffer 309 operations may be split over two tristate buffers, one to enable the value from Y1 to the data line 218 and another to enable the value from Y2 to the data line 218.

The load-reducing switching circuits 216 present a load on the data lines 218 from the write buffer 303 and the read buffer 309. The write buffer 303 is comparable to an input buffer on one of the memory devices 204, and the read buffer 309 is comparable to an output buffer on one of the memory devices 204. Therefore, the load-reducing switching circuits 216 present a load to the memory controller 201 that is substantially the same as the load that one of the memory devices 204 would present. Similarly, the load-reducing switching circuits 216 present a load on the first and second terminals Y1, Y2 from the multiplexer 308 and the first tristate buffer 304 (on the first terminal Y1) and the second tristate buffer 306 (on the second terminal Y2). The multiplexer 308 is comparable in loading to an input buffer on the memory controller 201, and the first and second tristate buffers 304, 306 are each comparable to an output buffer on the memory controller 201. Therefore, the load-reducing switching circuits 216 present a load to the memory devices 204 that is substantially the same as the load that the memory controller 201 would present.

Additionally, the load-reducing switching circuits 216 operate to ameliorate quality of the data signals passing between the memory controller 201 and the memory devices 204. Without the load-reducing switching circuits 216, waveforms of data signals may be substantially degraded or distorted from a desired shape between source and sink. For example, signal quality may be degraded by lossy transmission line characteristics, mismatch between characteristics of transmission line segments, signal crosstalk, or electrical noise. However, in the read direction, the read buffer 309 regenerates the signals from the memory devices 204 thereby restoring the desired signal waveform shapes. Similarly, in the write direction, the first tristate buffer 304 and the second tristate buffer 306 regenerate the signals from the memory controller 201 thereby restoring the desired signal waveform shapes.

Referring again to FIG. 3 when the memory controller 201 executes read or write operations, each specific operation is targeted to a specific one of the ranks A, B, C, and D of a specific module 202. The load-reducing switching circuit 216 on the specifically targeted one of the memory modules 202 functions as a bidirectional repeater/multiplexor, such that it drives the data signal when connecting from the system memory controller 201 to the memory devices 204. The other load-reducing switching circuits 216 on the remaining memory modules 202 are disabled for the specific operation. For example, the data signal entering on data line 218 entering into load-reducing switching circuit 216 is driven to memory devices 204A and 204C or 204B and 204C depending on which memory devices are active and enabled. The load-reducing switching circuit 216 then multiplexes the signal from the memory devices 204A, 204B, 204C, 204D to the system memory controller 201. The load-reducing switching circuits 216 may each control, for example, a nibble-wide data path or a byte-wide-data path. As discussed above, the load-reducing switching circuits 216 associated with each module 202 are operable to merge data read signals and to drive data write signals, enabling the proper data paths between the system memory controller 201 and the targeted or selected memory devices 204. Thus, the memory controller 201, when there are four four-rank memory modules, sees four load-reducing switching circuit loads, instead of sixteen memory device loads. The reduced load on the memory controller 201 enhances the performance and reduces the power requirements of the memory system, as compared with, for example, the conventional systems described above with reference to FIGS. 1 and 2.

Figure 5:
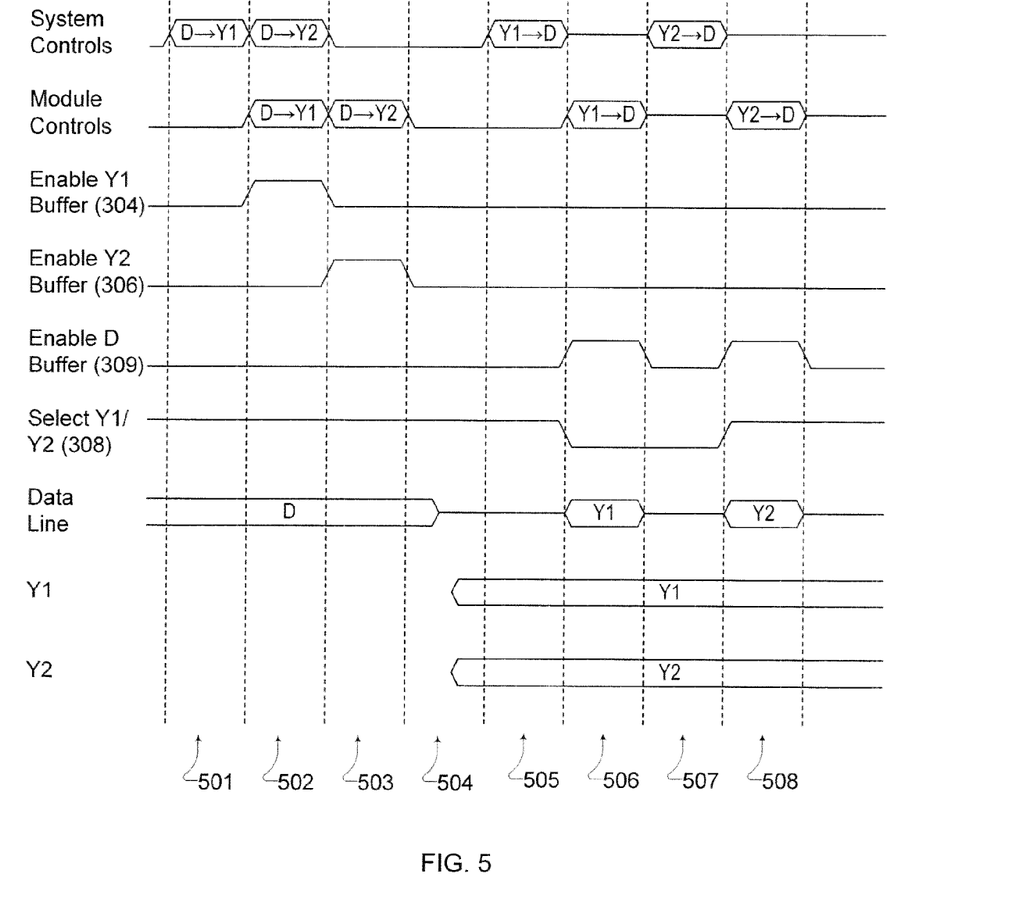
FIG. 5 is an exemplary timing diagram illustrating operation of the memory system of FIGS. 3 and 4.

Operation of a memory module using the load-reducing switching circuit 216 may be further understood with reference to FIG. 5, an illustrative timing diagram of signals of the memory module 202. The timing diagram includes first through eighth time periods 501-508. When the memory devices 204 are synchronous memories, each of the time periods 501-508 may correspond to one clock cycle of the memory devices 204.

The first, second, and third time periods 501-503 illustrate write operations with data passing from the memory controller 201 to the memory module 202. The fourth time period 504 is a transition between the write operations and subsequent read operations. The timing diagram shows a write operation to the first group of memory devices 204A, 204C connected to the first terminals Y1 of the load-reducing switching circuits 216 and a write operation to the second group of memory devices 204B, 204D connected to the second terminals Y2 of the load-reducing switching circuits 216. Recalling the CAS latency described above, each write operation extends over two time periods in a pipelined manner.

The write to the first group of memory devices 204A, 204C appears in the first time period 501 when system address and control signals 240 pass from the memory controller 201 to the module controller 220. The module controller 220 evaluates the address and control signals 240 to determine that data is to be written to memory devices 204A, 204C in the first group. During the second time period 502, the module controller 220 supplies control signals to the control logic circuitry 302 to enable the first tristate buffer 304 and to disable the second tristate buffer 306 and the read buffer 309. Thus, during the second time period 502, data bits pass from the data lines 218 to the first terminal Y1 and on to the memory devices 204A, 204C.

Similarly, the write to the second group of memory devices 204A, 204C appears in the second time period 502 when system address and control signals 240 pass from the memory controller 201 to the module controller 220. The module controller 220 evaluates the address and control signals 240 to determine that data is to be written to memory devices 204B, 204D in the second group. During the third time period 503, the module controller 220 supplies control signals to the control logic circuitry 302 to enable the second tristate buffer 306 and to disable the first tristate buffer 304 and the read buffer 309. Thus, during the third time period 503, data bits pass from the data lines 218 to the second terminal Y2 and on to the memory devices 204B, 204D.

The fifth, sixth, seventh, and eighth time periods 505-508 illustrate read operations with data passing to the memory controller 201 from the memory module 202. The timing diagram shows a read operation from the first group of memory devices 204A, 204C connected to the first terminals Y1 of the load-reducing switching circuits 216 and a read operation from the second group of memory devices 204B, 204D connected to the second terminals Y2 of the load-reducing switching circuits 216. Recalling the CAS latency described above, each read operation extends over two time periods in a pipelined manner.

The read from the first group of memory devices 204A, 204C appears in the fifth time period 505 when system address and control signals 240 pass from the memory controller 201 to the module controller 220. The module controller 220 evaluates the address and control signals 240 to determine that data is to be read from memory devices 204A, 204C in the first group. During the sixth time period 506, the module controller 220 supplies control signals to the control logic circuitry 302 to cause the multiplexer 308 to select data from the first terminal Y1, to enable the read buffer 309, and to disable the first tristate buffer 304 and the second tristate buffer 306. Thus, during the sixth time period 506, data bits pass from the memory devices 204A, 204C via the first terminal Y1 to data lines 218 and on to the memory controller 201.

The read from the second group of memory devices 204B, 204D appears in the seventh time period 507 when system address and control signals 240 pass from the memory controller 201 to the module controller 220. The module controller 220 evaluates the address and control signals 240 to determine that data is to be read from memory devices 204B, 204D in the second group. During the eighth time period 508, the module controller 220 supplies control signals to the control logic circuitry 302 to cause the multiplexer 308 to select data from the second terminal Y2, to enable the read buffer 309, and to disable the first tristate buffer 304 and the second tristate buffer 306. Thus, during the eighth time period 506, data bits pass from the memory devices 204B, 204D via the second terminal Y2 to data lines 218 and on to the memory controller 201.

Since other modifications and changes varied to fit particular operating requirements and environments will be apparent to those skilled in the art, the invention is not considered limited to the example chosen for purposes of disclosure. Accordingly, this disclosure encompasses all changes and modifications that do not constitute departures from the true spirit and scope of the subject matter of this disclosure.

What is claimed is:

1. A memory module to operate in a memory system with a memory controller, comprising:

a module controller configured to receive address/control signals from the memory controller and to output module control signals based on the received address/control Signals;

a plurality of sets of memory devices, each set of memory devices including at least two groups, each group including at least one memory device; and a plurality of load-reducing circuits distributed across the memory module in positions corresponding to respective sets of memory devices, each load-reducing circuit being associated with a respective set of memory devices and selecting a first group in the respective set of memory devices to communicate data with the memory controller in response to the module control signals, wherein during a write operation, each load-reducing circuit associated with a respective set of memory devices is configured to present a reduced load to the memory controller by isolating, in response to the module control signals, a second group in the respective set of memory devices from the memory controller, the reduced load being less than a load associated with both the first group and the second group;

wherein the plurality of sets of memory devices communicate with the memory controller via respective sets of data lines, and wherein the load-reducing circuits are inserted into the respective sets of data lines such that, during the write operation, the memory controller sees a single memory device load from the memory module on each data line;

wherein each load-reducing circuit associated with a respective set of memory devices includes a first data path coupled to a first group in the respective set of memory devices and a second data path coupled to a second group in the respective set of memory devices, the first data path including a first tristate buffer, the second data path including a second tristate buffer, wherein the first and second tristate buffers are controlled by at least one of the module control signals.

2. The memory module of claim 1, wherein the module control signals include one or more enable control signals.

3. The memory module of claim 1, wherein the module controller generates the module control signals by extracting control information from the received control/address information.

4. The memory module of claim 3, wherein the control information includes any one of a latency control information and column address strobe latency.

5. The memory module of claim 1, wherein the module controller evaluates, during a first time period, the received address/control signals to determine that data is to be written to the first group of at least one memory device in the respective set of memory devices.

6. The memory module of claim 5, wherein the module controller generates, during a second time period subsequent to the first time period, the module control signals based on the received address/control signals during the first time period, and supplies the module control signals to the load-reducing circuit associated with the respective set of memory devices.

7. The memory module of claim 1, wherein each load-reducing circuit associated with a respective set of memory devices includes write buffers to receive write data from the memory controller and to drive, in response to the module control signals, the write data to the first group of at least one memory device in the respective set of memory devices during the write operation.

8. The memory module of claim 1, wherein during a read operation, each load-reducing circuit associated with a respective set of memory devices is to select, in response to the module control signals, between the first group of at least one memory device and the second group of at least one memory device in the respective set of memory devices from which to receive read data, and to drive the read data to the memory controller.

9. The memory module of claim 1, wherein the plurality of sets of memory devices are organized in a plurality of ranks, wherein each set of memory devices includes at least one memory device from each rank.

10. The memory module of claim 1, wherein the load-reducing circuits are coupled to the module controller via a first set of module signal lines, and the module control signals are transmitted to the load-reducing circuits via the first set of module signal lines.

11. The memory module of claim 10, wherein each set of memory devices are coupled to the module controller via a second set of module signal lines and receive registered address/control signals from the module controller via the second set of module signal lines.

12. The memory module of claim 1, wherein the module controller is configured to transmit the module control signals to the plurality of load-reducing circuits but not to the plurality of sets of memory devices.

13. The memory module of claim 1, wherein each load-reducing circuit has a bit width that is the same as a bit width of one memory device.

14. The memory module of claim 1, wherein each load-reducing circuit has a bit width larger than a bit width of one memory device.

15. The memory module of claim 1, wherein each memory device of the plurality of sets of memory devices is selected from the group consisting of a dynamic random-access memory, synchronous dynamic random-access memory, and double-data-rate dynamic random-access memory.

16. A method of operating a memory module coupled to a memory controller, the memory module including a plurality of sets of memory devices, each set of memory devices including at least a first group of at least one memory device and a second group of at least one memory device, the method comprising:

receiving address/control signals from the memory controller; generating module control signals based on the received address/control signals;

transmitting the module control signals to a plurality of load-reducing circuits distributed across the memory module, each load-reducing circuit being associated with a respective set of memory devices; and using the module control signals to enable selected data paths in the load-reducing circuits during a write operation such that write data associated with the write operation is driven to the first group of at least one memory device and not to the second group of at least one memory device in each respective set of memory devices;

isolating, in response to the module control signals, the second group of at least one memory device in each respective set of memory devices from the memory controller during the write operation such that a reduced load is presented to the memory controller by each load-reducing circuit of the plurality of load-reducing circuits, the reduced load being less than a load associated with each set of memory devices;

wherein the plurality of sets of memory devices are to communicate with the memory controller via respective sets of data lines, and wherein the load-reducing circuits are inserted into respective sets of data lines such that, during the write operation, the memory controller sees a single memory device load from the memory module on each data line;

and wherein each load-reducing circuit associated with a respective set of memory devices includes a first data path coupled to a first group in the respective set of memory devices and a second data path coupled to a second group in the respective set of memory devices, the first data path including a first tristate buffer, the second data path including a second tristate buffer, wherein the first and second tristate buffers are controlled by at least one of the module control signals.

17. The method of claim 16, wherein the module control signals include one or more enable control signals derived from the received address/control signals.

18. The method of claim 16, wherein each load-reducing circuit has a bit width larger than a bit width of one memory device.

19. The method of claim 16, further comprising:
selecting, in response to the module control signals, between the first group of at least one memory device and the second group of at least one memory device in each respective set of memory devices to communicate read data with the memory controller during a read operation.

20. The method of claim 16, wherein the using of the module control signals to enable selected data paths in the load-reducing circuits comprises enabling at least one tristate buffer in each of the selected data paths.

* * * * *